United States Patent [19]
Oberhammer

[11] Patent Number: 5,914,634
[45] Date of Patent: Jun. 22, 1999

[54] MULTIPLE SWITCHABLE INPUT LNA WITH INPUT IMPEDANCE CONTROL

[75] Inventor: Wolfgang Oberhammer, Ottawa, Canada

[73] Assignee: Northern Telecom Limited, Montreal, Canada

[21] Appl. No.: 08/932,710

[22] Filed: Sep. 17, 1997

[51] Int. Cl.[6] .................................................. G06G 7/12
[52] U.S. Cl. .......................... 327/560; 455/341; 455/310; 455/137
[58] Field of Search ........................... 327/51, 560, 551; 455/296, 307, 310, 341, 137

[56] References Cited

U.S. PATENT DOCUMENTS

| | | | |
|---|---|---|---|
| 4,654,885 | 3/1987 | Meszko et al. | 455/219 |
| 4,761,828 | 8/1988 | Rinderle | 327/12 |
| 5,212,829 | 5/1993 | Brinkhaus | 455/296 |
| 5,625,365 | 4/1997 | Tom et al. | 454/700 MS |

OTHER PUBLICATIONS

"Low–Current RFIC Downconverter", pp. 1–14, (1994), TriQuint Semiconductor.
Mohindra, "Isolator For DECT Open Loop Modulation", RF Synthesizers, pp. 30–42, (1996).

*Primary Examiner*—Timothy P. Callahan
*Assistant Examiner*—Jung Ho Kim

[57] ABSTRACT

An amplifier circuit has an amplifying transistor which is switched on and off by a switching transistor under control of a control signal selectively applied to the switching transistor. In this way a selection is made whether or not to amplify an input signal on an antenna. The switching transistor forms part of the biasing circuit for the amplifying transistor such that when the switching transistor is on the amplifying transistor is biased off. A PIN diode and series resistor are together connected in shunt across the switching transistor such that the bias voltage which causes the amplifying transistor to be off causes the PIN diode to be forward biased thereby causing the antenna to be terminated with the resistor the value of which may be chosen to be 50 ohms.

27 Claims, 3 Drawing Sheets

MULTIPLE SWITCHABLE INPUT LNA WITH INPUT IMPEDANCE CONTROL

FIELD OF THE INVENTION

This invention relates to amplifier circuitry particularly but not exclusively intended for use in selective connection to either of two (or more) antennas feeding a radio receiver.

BACKGROUND OF THE INVENTION

In cellular wireless communications large cells are often sectored to increase cell capacity. Typically, three 120° sector antennas are used to cover one cell and a receiver is switched between the three sector antennas.

Another application which involves switching a receiver between two or more antennas is space diversity which is used to reduce the effect of multipath fading in radio receivers. By using two antennas placed an adequate distance apart, a receiver can be made such that it selects the one with the strongest signal, thereby giving an overall improvement in reception.

FIG. 1(a) shows the basic concept in which a switch selectively connects a low noise amplifier (LNA) forming part of the receiver to one or other of two antennas. This arrangement, however, is generally not practical since the switch will have some insertion loss which will degrade the receiver's sensitivity to weak signals. FIG. 1(b) shows the common topology with the switch moved farther down the receiver chain for greater sensitivity. In this case two LNAs are connected between the respective antennas and the switch such that, in effect, the switch selects the output of one or other of the LNA's. A problem with this arrangement is that, as both LNA's are running continuously, it requires twice the current and is more complicated because it requires additional output switch circuitry.

The problem of high current requirement is overcome in a device marketed under the part number TQ9203 by Triquint Semiconductor, Inc. as described in the Triquint data sheet entitled "Low-Current RFIC Downconverter" and dated Apr. 21, 1994. This device is a multifunction RF downconverter in which an LNA section comprises two parallel connected common source FET (field effect transistor) amplifiers each having an input connected to a respective antenna and a common output. A "Select" or "Control" terminal controls a bias circuit connected directly to the gates of the two transistors such that, when a control signal indicative of a stronger reception signal on one antenna is applied, the transistor connected to the one antenna is switched on and the other transistor is switched off and, when the control signal has a value indicative of a stronger signal on the other antenna, the transistors are switched to the opposite state. In this way the stronger antenna signal is conducted to the common output.

One problem with the Triquint device is that it has a relatively high gain variation with temperature. In addition it is designed only for operation in the range 800 to 1000 MHz and would not work at low frequency because of AC coupled inputs.

A device which overcomes the above-mentioned disadvantages of the prior art devices is disclosed in U.S. patent application Ser. No. 08/822,460 filed on Mar. 21, 1997 in the name of Tiller et al and assigned to the assignee of the present application. The disclosure of U.S. patent application Ser. No. 08/822,460 is incorporated herein by reference.

In a particular embodiment described in the Tiller et al application three antennas are respectively connected to three amplifying transistors which have a common output and three control inputs are connected respectively to three switching transistors. When a particular one of the control inputs receives a control voltage indicating that the associated antenna is to be selected, the respective switching transistors turns on such that current flows in the corresponding amplifying transistor. This circuit uses for each amplifying transistor a bias feedback circuit which includes resistors in series with the switching transistor.

A potential drawback of the Tiller et al device is that those antennas which are not selected are simply disabled and are not terminated into a fixed resistance. The effect of this is that a poor return loss is associated with the disabled antenna inputs. Because radio base station transceivers are required to be terminated to 50 ohms this means that the Tiller et al device cannot be used in base stations having such requirements without modification.

SUMMARY OF THE INVENTION

It is an object of the invention to provide a device which improves over the prior art in the same way as the Tiller et al device and which, in addition, meets the termination return loss requirements of base station applications.

According to a first broad aspect, the present invention provides an amplifier circuit comprising: an amplifying transistor having an input electrode, an output electrode and a common electrode; a signal input connected to the input electrode of the amplifying transistor; a signal output connected to the output electrode of the amplifying transistor; a first bias circuit connected between a first DC biasing input and the input electrode of the amplifying transistor; a second bias circuit connected between a second DC biasing input and the input electrode of the amplifying transistor, the second bias circuit including a switching transistor switched on and off by a DC control input thereby to switch the amplifying transistor on and off; a PIN diode connected to the signal input and a resistor connected in series with the diode, the diode and resistor connected in shunt with the second bias circuit, whereby when the DC control input causes the amplifying transistor to be on the diode is reverse biased and when the DC control input causes the amplifying transistor to be off the diode is forward biased thereby supplying the resistance of the resistor to the signal input.

According to a second broad aspect, the present invention provides an amplifier circuit comprising: a first amplifying transistor having an input electrode, an output electrode and a common electrode; a first signal input connected to the input electrode of the first amplifying transistor; a second amplifying transistor having an input electrode, an output electrode and a common electrode; a second signal input connected to the input electrode of the second amplifying transistor; a common signal output connected to the output electrodes of the first and second transistors; a first bias circuit connected between a first DC biasing input and the input electrode of the first amplifying transistor; a second bias circuit connected between the first DC biasing input and the input electrode of the second amplifying transistor; a third bias circuit connected between a second Dc biasing input and the input electrode of the first amplifying transistor; a fourth bias circuit connected between the second DC biasing input and the input electrode of the second amplifying transistor; the third bias circuit including a first switching transistor switched on and off by a first DC control input and the fourth bias circuit including a second switching transistor switched on and off by a second DC control input; a first diode connected to the first signal input and a first resistor connected in series with the first diode, the first diode and first resistor connected in shunt with the third bias circuit, whereby when the first DC control input causes the first amplifying transistor to be on the first diode is reverse biased and when the first DC control input causes the first amplifying transistor to be off the first diode is forward biased thereby supplying the resistance of the first resistor to the first signal input; and a second diode connected to the second signal input and a second resistor connected in series with the second diode, the second diode and second resistor connected in shunt with the fourth bias circuit, whereby when the second DC control input causes the second amplifying transistor to be on the second diode is reverse biased and when the second DC control input causes the second amplifying transistor to be off the second diode is reverse biased thereby supplying the resistance of the second resistor to the second signal input.

The diode as in the first broad aspect or both diodes as in the second broad aspect are preferably PIN diodes.

BRIEF DESCRIPTION OF THE DRAWINGS

Preferred embodiments of this invention will now be described with reference to the attached drawings in which.

DETAILED DESCRIPTION OF THE PREFERRED EMBODIMENTS

Figure 2:
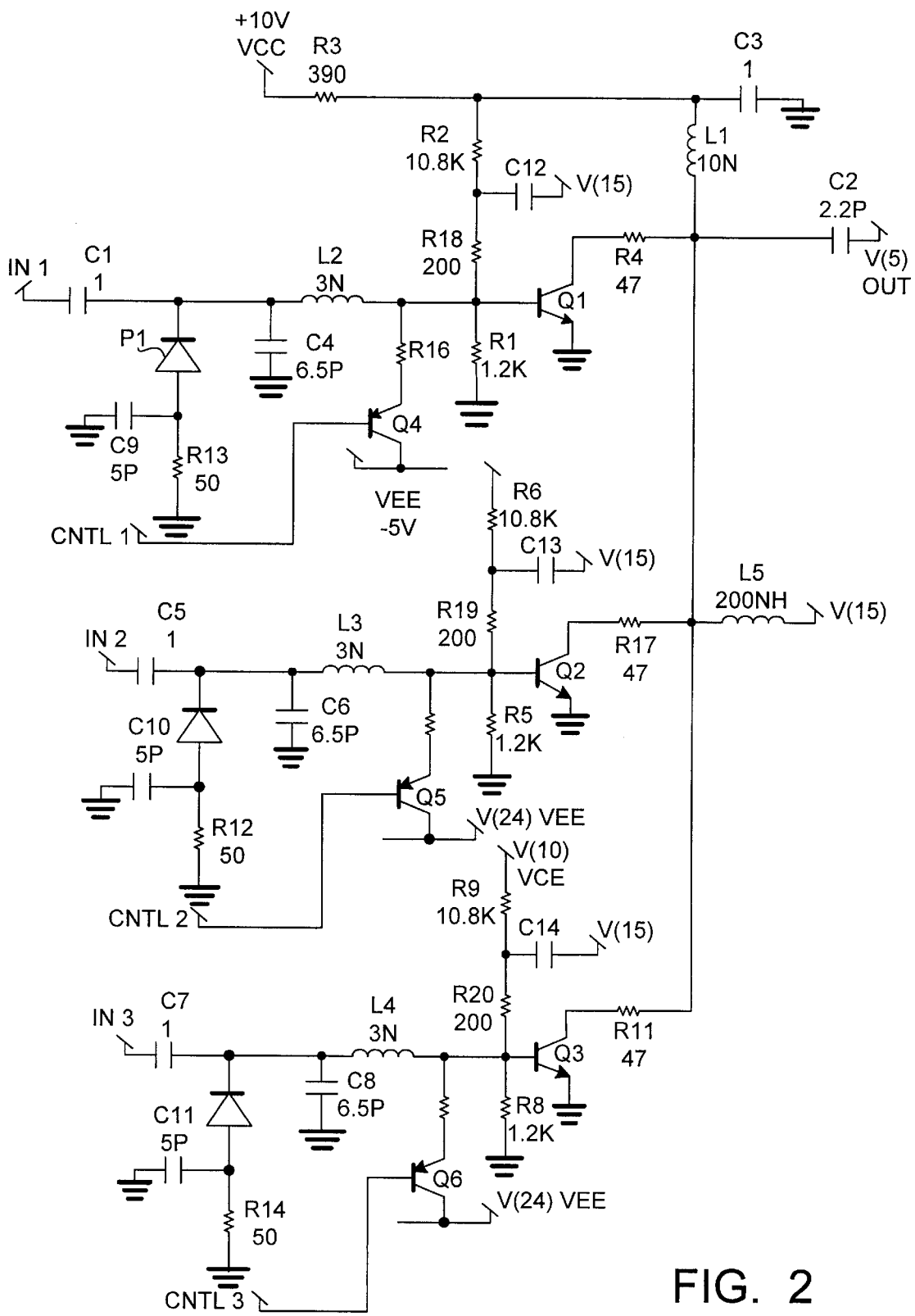
FIG. 2 is a schematic diagram illustrating a triple LNA according to one embodiment of the present invention.

Referring to FIG. 2, a triple LNA circuit is illustrated in which Q1, Q2 and Q3 are single transistor LNA stages sharing output matching inductor L1 and capacitor C2. Three antenna signal inputs IN1, IN2, IN3 are connected respectively from three antennas to the three transistor LNA stages and there is a single output node, OUT. To determine which of the three inputs is selected three control inputs CNTL1, CNTL2 and CNTL3 are respectively connected into the three LNA stages.

The components and interconnections used in each LNA stage are substantially identical and, accordingly, only those associated with the first LNA stage will be described in detail. The first LNA stage comprises a bipolar common emitter NPN transistor Q1. A positive bias voltage (typically +10 volts) source VCC is connected through a resistor R3, a resistor R2 and a resistor R18 to the base of transistor Q1. A resistor R1 is connected between the base and the emitter of transistor Q1 and a resistor R4 is connected between the collector of transistor Q1 and output node OUT through matching capacitor C2. The junction of resistors R2 and R3 is connected to one end of an inductor L1 the other end of which is connected to the junction of resistor R4 and capacitor C2. A capacitor C3 is provided between the junction of resistors R3 and R2 and ground.

The first LNA stage includes a complementary (PNP) switching transistor Q4 the emitter of which is connected through a resistor R16 to the base of transistor Q1. A negative bias voltage (typically −5 volts) source VEE is connected to the collector of transistor Q4 and control input CNTL1 is connected to the base of transistor Q4.

Input IN1 from the first antenna is connected through a capacitor C1 to the cathode of a PIN diode P1 the anode of which is connected through a 50 ohm resistor R13 to ground. A capacitor C9 is connected between the junction of diode P1 and resistor R13 to ground. A matching circuit comprises an inductor L2 connected between capacitor C1 and the base of transistor Q1 and a capacitor C4 connected between the junction of capacitor C1 and inductor L2 and ground.

In operation, if the control signal CNTL1 is similar in value to the positive supply voltage VCC, switching transistor Q4 is biased off. When switching transistor Q4 is off resistors R3, R2, R1 and R18 provide a constant forward bias current to transistor Q1 causing transistor Q1 to be biased on and amplify the antenna signal IN1 and pass the amplified signal to the OUT node. In this forward biased configuration the base voltage of transistor Q1 is between +0.7 and +0.8 volts. With +0.7 to +0.8 volts acting on the cathode of diode P1 the diode is reverse biased. In this mode the diode P1 has a capacitance of the order of about 0.2 pF. With a slight adjustment in the shunt matching capacitor C4, the effect of the diode is negligible in this mode.

If the control signal CNTL1 goes to a negative value such that switching transistor Q4 turns on, the amplifying transistor Q1 turns off. The bias resistors R3, R2, R1 and R18 along with the collector resistor R16 of transistor Q4 voltage divide sources VCC and VEE. These resistors can be selected such that the voltage on the base will forward bias the PIN diode P1 to 1 mA. The diode P1 may be an HP HSMP3820 diode available from Hewlett Packard which has a resistance of 1 ohm in this mode. Thus, the total resistance seen by the input IN1 when disabled is essentially the resistance of resistor R13 which is chosen as 50 ohm. Capacitor C9 is used to resonate out the reactance of the matching elements C4 and L2.

To summarize the effect of the shunt biased switch Q4, when transistor Q4 is switched off by the voltage on CNTL1 this does not affect the stabilized self bias of the amplifying transistor Q1 which is switched on. When transistor Q4 is switched on by the voltage on CNTL1, voltage division between the bias resistors and the newly connected negative voltage VEE results in a negative voltage on the base of transistor Q1 switching it off. The reversal in bias on transistor Q1 causes the PIN to be forward biased to apply substantially a 50 ohm load to the disabled input IN1. Thus, a separate bias circuit for the PIN diode P1 is unnecessary.

The two other stages operate in exactly the same way as that of Q1. For the following discussion on stability note that resistors R7 and R11 connected to the collectors of amplifying transistors Q2 and Q3 correspond to resistor R4 of amplifying transistor Q1. Also, resistors R19 and R20 correspond exactly to resistor R18 except that they are respectively connected to transistors Q2 and Q3.

In FIG. 2, resistors R4, R7 and R11 are provided for high frequency stability. Low frequency stability is provided by a feedback circuit comprising an inductor L5 having one end connected to the junction of resistors R4, R7, R11 and output capacitor C2 and having the other end connected to resistors R18, R19 and R20 through respective capacitors C12, C13 and C14.

FIG. 2 does indicate suggested values for the various components but these are to be considered as a guide only.

It is noted that capacitor C9 may be an inductor or any combination of inductor and capacitor as appropriate to resonate out the effect of the matching elements.

Figure 3:
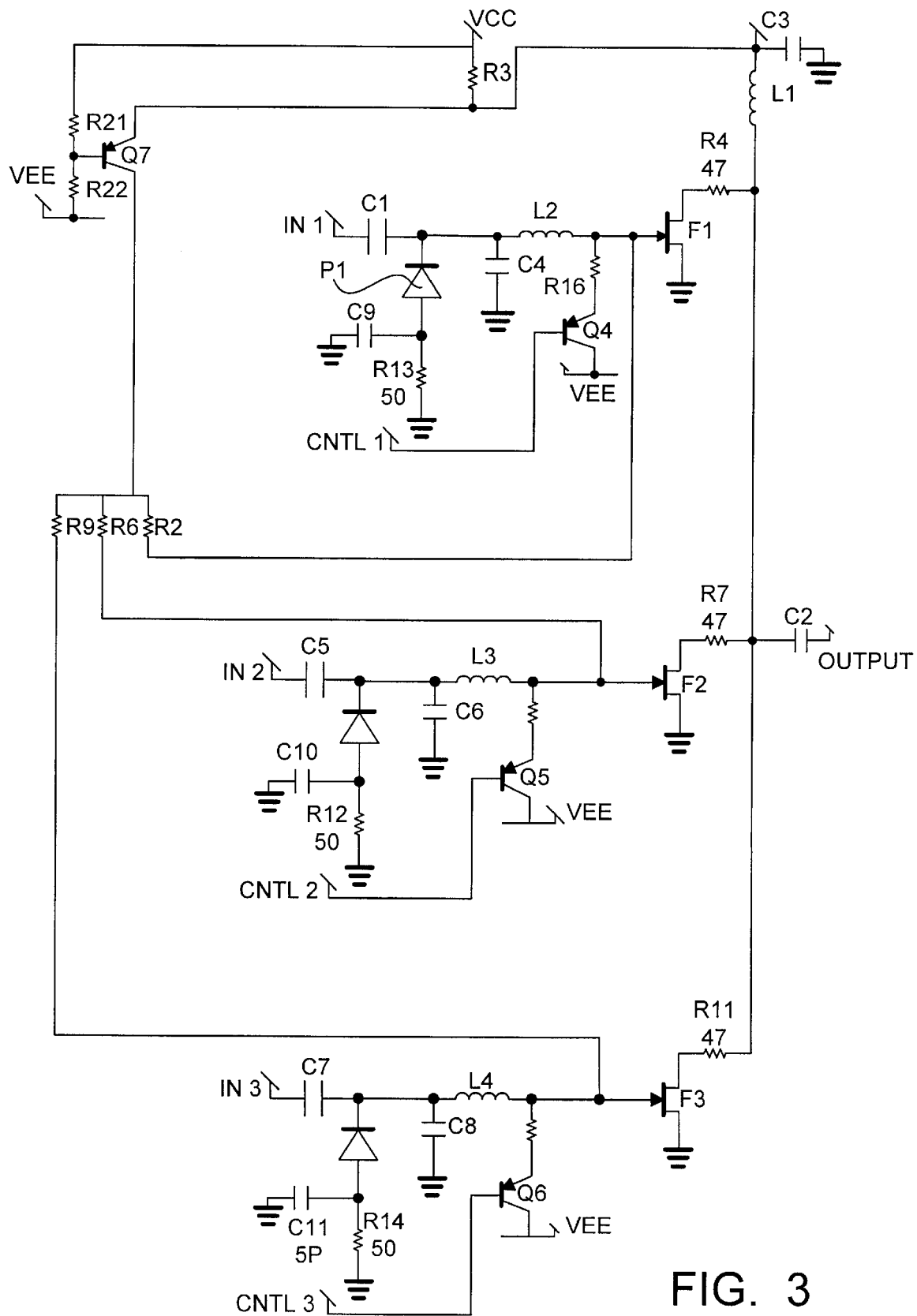
FIG. 3 is a schematic diagram illustrating a triple LNA according to another embodiment of the present invention.

FIG. 3 illustrates an embodiment of the invention using enhancement mode MESFET's as the amplifying transistors, i.e., MESFET's F1, F2 and F3 replace bipolar junction transistors Q1, Q2 and Q3 respectively. Because the pinch-off voltage of a MESFET can vary widely from device to device the biasing circuitry has to be modified. More particularly, it can be seen by comparing FIGS. 2 and 3 that, in addition to the replacement of Q1, Q2 and Q3 with MESFET's F1, F2 and F3 the main difference is the addition of NPN transistor Q7. This transistor has its emitter connected through the resistor R3 to the positive voltage source VCC, its base connected through a resistor R21 to source VCC and connected through a resistor R22 to the negative voltage source VEE and its collector connected to the gates of the three enhancement mode MESFETS F1, F2, F3, respectively through resistors R2, R6 and R9. The circuit of FIG. 3 is in other respects essentially identical to the circuit of FIG. 2 and like components bear like references.

Transistor Q7 is forward biased by resistors R21 and R22 and normally biases one of the FETS F1, F2 or F3 on providing the associated switching transistor Q4, Q5 or Q6 is off. Because the DC current required to bias an FET on is small, R2, R6 and R9 can be large and the current required by transistor Q7 is small. The value of R3 is therefore determined mainly by the MESFET drain to source current.

When the control signal CNTL1 is negative such that transistor Q4 turns on, the resistors R2 and R16 voltage divide the collector voltage VGC of transistor Q7 and voltage source VEE to provide a negative gate voltage at FET F1 causing it to be off. The voltage VGC is set by the gate voltage requirement to switch on FET F1. As with the circuit of FIG. 2 this negative voltage forward biases the PIN diode P1 to provide the 50 ohm resistance of resistor R13 as the resistance seen by input IN1 when disabled.

When the control signal CNTL1 is positive such that transistor Q4 turns off, the FET F1 is biased on by the positive bias voltage provided to the gate of FET F1. The circuit drawn through the resistor R3 by FET F1 causes the voltage at the emitter of transistor Q7 to drop. Once the emitter base voltage on transistor Q7 drops to about 0.7V, conduction of transistor Q7 decreases and the gate voltage on FET F1 drops.

Hence the gate voltage of FET F1 is set by resistor R3 for a constant drain/source current. The gate voltage required for a specific drain/source current is a function of pinch off voltage. As mentioned above, pinch off voltage may vary widely from one device to the next but the collector voltage of transistor Q7 will adapt itself to satisfy the 0.7V base/ emitter voltage which in turn is set by the drain/source current of FET X9. Thus, transistor Q7 as well as resistors R3, R21, R22 and R2 set the active bias current of FET F1 independent of the device characteristics of FET F1.

As with the circuit of FIG. 2, the positive bias voltage (applied to the gate of FET F1) reverse biases the PIN diode P1 such that, when input IN1 is enabled, the resistance of resistor R13 is not seen at input IN1.

It is noted that the invention may be practised other than as particularly described with reference to the preferred embodiments. For example, although a PIN diode is preferred for diode P1 because of its particular characteristics, other diodes such as a Schottky diode may be used in the invention but are not expected to be as effective because of non-linear response. More particularly, a PIN diode has a very long carrier life time. When the diode is on, an RF signal will not be able to affect the operation of the diode. In contrast, a Schottky diode can be turned on and off by RF and microwave signals. Thus, when a PIN diode is on it looks like a resistor and when it is in the off state a large reverse voltage will prevent the diode from being biased on by an RF signal. Operation of a PIN diode in a switching configuration can therefore, be made very linear.

Figure 1A:
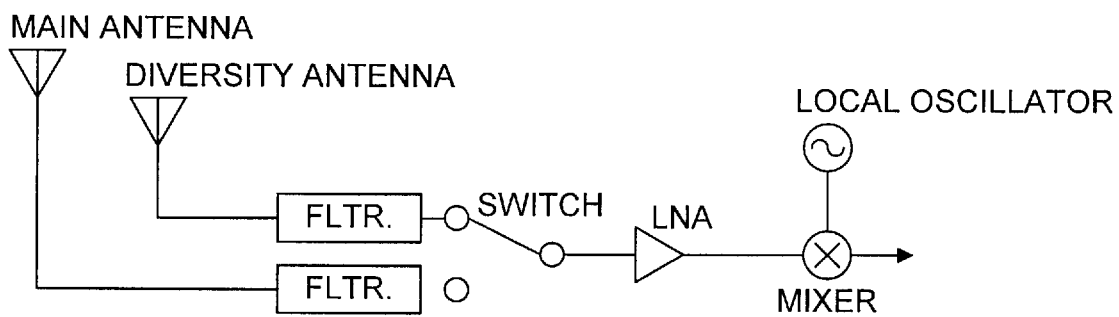
FIG. 1(a) is a block diagram illustrating an antenna diversity receiver front end according to a first prior art embodiment.
Figure 1B:
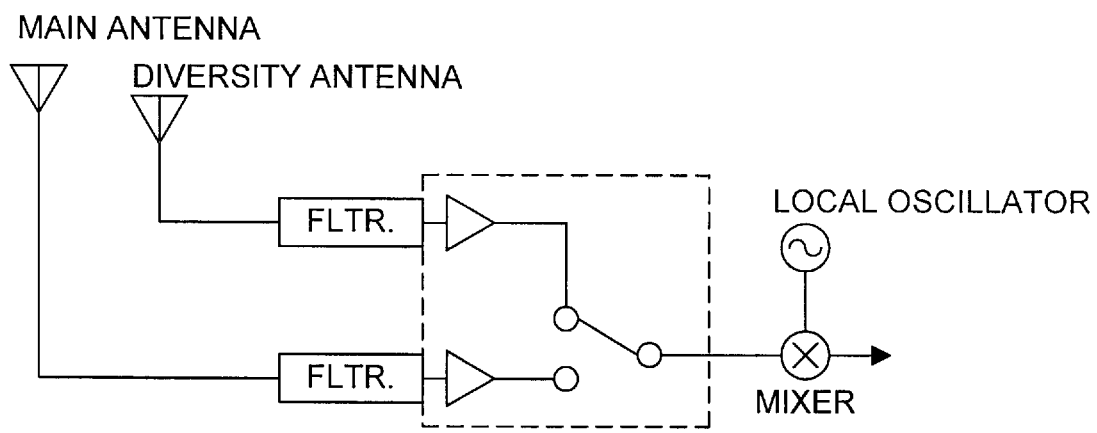
FIG. 1(b) is a block diagram illustrating an antenna diversity receiver front end according to a second prior art embodiment.

In addition, although the preferred embodiment illustrated in FIG. 1 uses PNP switching transistors and NPN amplifying transistors, these could be swapped around or both could be PNP or NPN with appropriate changes in biasing. However, it is noted that PNP transistors are not good amplifiers at RF and so the use of NPN amplifying transistors is preferred.

Further, the active bias arrangement involving the use of transistor Q7 could be used with the bipolar circuitry of FIG. 2 with proper choice of component values. This active bias is less sensitive in temperature and device current gain than the passive bias arrangement shown in FIG. 2.

Finally, although the FET's in FIG. 3 are preferably enhancement mode MESFET's, other types of FET's such as MOSFET's could be used with suitable biasing.

I claim:

1. An amplifier circuit comprising:
   an amplifying transistor having an input electrode, an output electrode and a common electrode;
   a signal input connected to the input electrode of the amplifying transistor;
   a signal output connected to the output electrode of the amplifying transistor;
   a first bias circuit connected between a first DC biasing input and the input electrode of the amplifying transistor;
   a second bias circuit connected between a second DC biasing input and the input electrode of the amplifying transistor, the second bias circuit including a switching transistor switched on and off by a DC control input thereby to switch the amplifying transistor on and off;
   a diode connected to the signal input and a resistor connected in series with the diode, the diode and resistor connected in shunt with the second bias circuit, whereby when the DC control input causes the amplifying transistor to be on the diode is reverse biased and when the DC control input causes the amplifying transistor to be off the diode is forward biased thereby supplying the resistance of the resistor to the signal input.

2. An amplifier circuit according to claim 1, wherein the diode is a PIN diode.

3. An amplifier circuit according to claim 1, wherein the amplifying transistor and the switching transistor are complementary bipolar transistors.

4. An amplifier circuit according to claim 2, wherein the amplifying transistor and the switching transistor are complementary bipolar transistors.

5. An amplifier circuit according to claim 3, wherein the first bias circuit comprises bias resistors.

6. An amplifier circuit according to claim 4, wherein the first bias circuit comprises bias resistors.

7. An amplifier circuit according to claim 5, wherein a resistor is connected between the output electrode of the amplifying transistor and the signal output for high frequency stability and a feedback circuit is connected from the signal output to the input electrode of the amplifying transistor for low frequency stability.

8. An amplifier circuit according to claim 6, wherein a resistor is connected between the output electrode of the amplifying transistor and the signal output for high frequency stability and a feedback circuit is connected from the signal output to the input electrode of the amplifying transistor for low frequency stability.

9. An amplifier circuit according to claim 1, wherein the amplifying transistor is an FET and the switching transistor is a bipolar transistor.

10. An amplifier circuit according to claim 2, wherein the amplifying transistor is an FET and the switching transistor is a bipolar transistor.

11. An amplifier circuit according to claim 9, wherein the first bias circuit is an active bias circuit comprising resistors and a forward biased transistor.

12. An amplifier circuit according to claim 10, wherein the first bias circuit is an active bias circuit comprising resistors and a forward biased transistor.

13. An amplifier circuit according to claim 3, wherein the first bias circuit is an active bias circuit comprising resistors and a forward biased transistor.

14. An amplifier circuit according to claim 4, wherein the first bias circuit is an active bias circuit comprising resistors and a forward biased transistor.

15. An amplifier circuit according to claim 1, wherein a matching circuit is connected between the signal input and the input electrode of the amplifying transistors and a reactance circuit is connected across the shunt resistor to resonate out the effect of the matching circuit.

16. An amplifier circuit according to claim 2, wherein a matching circuit is connected between the signal input and the input electrode of the amplifying transistors and a reactance circuit is connected across the shunt resistor to resonate out the effect of the matching circuit.

17. An amplifier circuit comprising:
    a first amplifying transistor having an input electrode, an output electrode and a common electrode;
    a first signal input connected to the input electrode of the first amplifying transistor;
    a second amplifying transistor having an input electrode, an output electrode and a common electrode;
    a second signal input connected to the input electrode of the second amplifying transistor;
    a common signal output connected to the output electrodes of the first and second transistors;
    a first bias circuit connected between a first DC biasing input and the input electrode of the first amplifying transistor;
    a second bias circuit connected between the first DC biasing input and the input electrode of the second amplifying transistor;
    a third bias circuit connected between a second Dc biasing input and the input electrode of the first amplifying transistor;
    a fourth bias circuit connected between the second DC biasing input and the input electrode of the second amplifying transistor;
    the third bias circuit including a first switching transistor switched on and off by a first DC control input and the fourth bias circuit including a second switching transistor switched on and off by a second DC control input;
    a first diode connected to the first signal input and a first resistor connected in series with the first diode, the first diode and first resistor connected in shunt with the third bias circuit, whereby when the first DC control input causes the first amplifying transistor to be on the first diode is reverse biased and when the first DC control input causes the first amplifying transistor to be off the first diode is forward biased thereby supplying the resistance of the first resistor to the first signal input; and
    a second diode connected to the second signal input and a second resistor connected in series with the second diode, the second diode and second resistor connected in shunt with the fourth bias circuit, whereby when the second DC control input causes the second amplifying transistor to be on the second diode is reverse biased and when the second DC control input causes the second amplifying transistor to be off the second diode is reverse biased thereby supplying the resistance of the second resistor to the second signal input.

18. An amplifier circuit according to claim 17, wherein the first and second diodes are PIN diodes.

19. An amplifier circuit according to claim 17, wherein the first amplifying transistor and the first switching transistor are complementary bipolar transistors and the second amplifying transistor and the second switching transistor are complementary bipolar transistors.

20. An amplifier circuit according to claim 18, wherein the first amplifying transistor and the first switching transistor are complementary bipolar transistors and the second amplifying transistor and the second switching transistor are complementary bipolar transistors.

21. An amplifier circuit according to claim 17, wherein the first bias circuit comprises bias resistors and the second bias circuit comprises bias resistors.

22. An amplifier circuit according to claim 18, wherein the first bias circuit comprises bias resistors and the second bias circuit comprises bias resistors.

23. An amplifier circuit according to claim 17, wherein the first and second amplifying transistors are FETS and the first and second switching transistors are bipolar transistors.

24. An amplifier circuit according to claim 18, wherein the first and second amplifying transistors are FETS and the first and second switching transistors are bipolar transistors.

25. An amplifier circuit according to claim 23, wherein the first bias circuit is an active bias circuit comprising resistors and a forward biased transistor and the second bias circuit is an active bias circuit comprising further resistors and the forward biased transistor.

26. An amplifier circuit according to claim 24, wherein the first bias circuit is an active bias circuit comprising resistors and a forward biased transistor and the second bias circuit is an active bias circuit comprising further resistors and the forward biased transistor.

27. An amplifier circuit comprising:
    an NPN transistor having a base, a collector and a common emitter;
    a signal input connected through a matching circuit to the base of the amplifying transistor;
    a first bias circuit comprising resistors connected between a positive DC voltage source and the base of the amplifying transistor;
    a second bias circuit connected between a negative QC voltage source and the base of the amplifying transistor, the second bias circuit including a PNP switching transistor having a base, a collector and a common emitter, the emitter being connected to the negative voltage source, the collector being connected through a resistor to the base of the amplifying transistor and the base being connected to a DC control input thereby to switch the switching transistor selectively on or off which in turn makes the amplifying transistor non-conducting or conducting, respectively;
    a PIN diode connected to the signal input and a resistor connected in series with the PIN diode, the PIN diode and resistor connected in shunt with the second bias circuit, whereby when the amplifying transistor is conducting the PIN diode is reverse biased and when the amplifying transistor is non-conducting the PIN diode is forward biased thereby supply the resistance of the resistor to the signal input.

* * * * *